United States Patent [19]

Yamada

[11] Patent Number: 4,599,000

[45] Date of Patent: Jul. 8, 1986

[54] POSITION DETECTION SIGNAL PROCESSING APPARATUS

[75] Inventor: Yasuyoshi Yamada, Tokyo, Japan

[73] Assignee: Canon Kabushiki Kaisha, Tokyo, Japan

[21] Appl. No.: 465,103

[22] Filed: Feb. 9, 1983

[30] Foreign Application Priority Data

Feb. 19, 1982 [JP] Japan .................................. 57-25677

[51] Int. Cl.⁴ ............................................. G01B 11/00
[52] U.S. Cl. ...................................... 356/401; 356/400
[58] Field of Search ............... 356/373, 375, 399, 400, 356/401; 250/548, 557

[56] References Cited

U.S. PATENT DOCUMENTS

3,955,072  5/1976  Johannsmeier et al. ............. 356/400
4,291,334  9/1981  Mese et al. ........................... 356/401
4,315,201  2/1982  Suzuki et al. ........................ 356/400

*Primary Examiner*—R. A. Rosenberger
*Assistant Examiner*—Crystal Cooper
*Attorney, Agent, or Firm*—Fitzpatrick, Cella, Harper & Scinto

[57] ABSTRACT

Disclosed is a position detection signal processing apparatus to be used with a first body having a first pattern for alignment and a second body having a second pattern. The apparatus includes a pattern detecting device for detecting the first and second patterns and producing a detection signal stream, an expectation pulse forming circuit for forming an expectation pulse signal for specifying the portion of the detection signal stream in which the probability with which signals corresponding to the first and second patterns exist is high, and a true signal forming circuit for forming true signal streams corresponding to the first and second patterns from the detection signal stream and the expectation pulse signal.

24 Claims, 24 Drawing Figures

POSITION DETECTION SIGNAL PROCESSING APPARATUS

BACKGROUND OF THE INVENTION

1. Field of the Invention

This invention relates to a signal processing apparatus and method used to measure the relative position of a plurality of bodies, and more particularly it relates to such a signal processing apparatus and method suitable for application to a system for aligning a mask and a wafer highly accurately in a semiconductor manufacturing apparatus.

2. Description of the Prior Art

In a semiconductor manufacturing apparatus, especially a pattern printing apparatus, it is the usual practice to photoelectrically detect alignment marks in order to detect the relative position of a mask and a wafer. It is to be understood that the term "marks" used herein refers not only to the indicia added only for alignment, but also to the body itself, for example, a part or the whole of the circuit element, where it is used for alignment.

Where photoelectric detection is to be effected, there is known a method in which a laser, for example, is used as a light source and alignment marks in overlapping relation are scanned and the scattered light therefrom is received by a photodiode or a photomultiplier and photoelectrically converted, whereby the relative position of the alignment marks is found from the electrical signal, also known is a method in which the images of alignment marks are received by an image pickup device such as an image pickup tube or a photosensor array and the entire alignment mark images are photoelectrically converted and input to a signal processing device, whereby the relative position of the alignment marks is found by a calculating process.

However, in the system wherein the marks are beam-spot-scanned along the same track, it has often been difficult to discriminate between the false signals of dust and aluminum particles lying on the body and the true signals regarding the alignment marks. Also, in the system using the image pickup device, it has been necessary to apply complicated signal processing after the entire picture plane has been input, and this has led to a long processing time and thus a slowed printing process or a very high cost or bulkiness of the apparatus. The assignee of the present invention has previously proposed Japanese Patent Application No. 66898/1977 to overcome the difficultes resulting from false signals, but the present invention pertains to improvements different therefrom.

SUMMARY OF THE INVENTION

It is a first object of the present invention to form a true signal for accurately measuring the position of a body to be detected even if the body may produce a false signal.

It is a second object of the present invention to detect the alignment pattern of the body and form a detection signal stream and specify the portion of this detection signal stream in which the probability with which a signal corresponding to the alignment pattern exists is high.

It is a third object of the present invention to separate from the detection signal the portion in which the probability with which signals corresponding to alignment marks exist is high, extract the signals by the alignment marks by referring to said portion and find the exact relative position of a mask and a wafer.

Some embodiments of the present invention will hereinafter be described. The alignment marks used in the embodiments have previously been described in Japanese Patent Application No. 5502/1977 (U.S. Pat. No. 4,167,677), but the present invention can also be carried out with other marks than the marks of the shape described therein.

BRIEF DESCRIPTION OF THE DRAWINGS

FIGS. 3(1)–(3) are front views of marks and FIGS. 3(4)–(8) show signal waveforms.

FIGS. 9(1)–(3) are front views of marks and FIGS. 9(4)–(6) show signal waveforms.

FIGS. 11(1) and (2) show signal waveforms.

DESCRIPTION OF THE PREFERRED EMBODIMENTS

Figure 1:
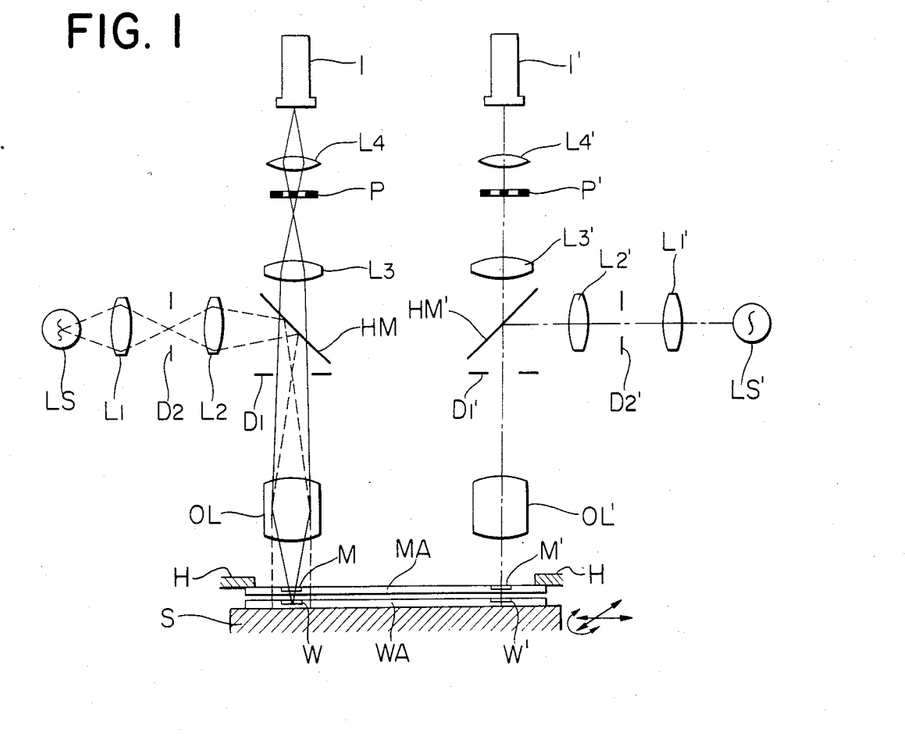
FIG. 1 is a cross-sectional view of an image receiving system according to a first embodiment of the present invention.

FIG. 1 shows an image detecting system according to a first embodiment of the present invention. This system will first be described, and then a signal processing system will be described.

In FIG. 1, a mask MA carrying thereon a pattern to be printed is held by a holder H. A wafer WA provided with a photosensitive layer is fixed on a stage S and may be moved back and forth and from left to right in a horizontal plane and rotated by the stage S. Letters M and M′ designate alignment marks on the mask and letters W and W′ denote alignment marks on the wafer. It is desired to align the marks M and W and the marks M′ and W′.

Further, OL and OL′ designate microscope objective lenses, $D_1$ and $D'_1$ denote diaphragms disposed on the focal planes of the objective lenses OL and OL′ opposite to an object, and HM and HM′ designate half-mirrors obliquely disposed on the optical axis. $L_1$, $L_2$, $L'_1$ and $L'_2$ designate condenser lenses for illumination, and LS and LS′ denote illuminating lamps. The images of the illuminating lamps LS and LS′ are formed at the positions of the diaphragms $D_1$ and $D'_1$, respectively, by the condenser lenses $L_1$ and $L_2$ or $L'_1$ and $L'_2$. $D_2$ and $D'_2$ denote illumination view field diaphragms for controlling the light beam at positions whereat the images of the light sources are formed by the condenser lenses $L_1$ and $L'_1$.

The objective lenses OL and OL′, the diaphragms $D_1$ and $D'_1$ the half-mirrors HM and HM′, the condenser lenses $L_1$, $L_2$, $L'_1$ and $L'_2$ and the light sources LS and LS′ together constitute a reflection illumination system.

$L_3$, $L_4$, $L'_3$ and $L'_4$ designate relay lenses, and P and P′ denote light-intercepting plates having the function of covering the positive reflected images of the illuminating light sources by the mask and wafer. The objective lenses OL and OL', the relay lenses $L_3$, $L_4$, $L'_3$ and $L'_4$ and the light-intercepting plates P and P' together constitute a light-receiving system.

The light beam emitted from the light source LS is condensed by the condenser lens $L_1$, whereafter it is imaged on the surface of the diaphragm $D_1$ by the second condenser lens $L_2$ and is made into a parallel beam by the objective lens OL and illuminates the mask MA and the wafer WA. The light beam scattered and reflected by the mark M of the mask and the mark W of the wafer is imaged by the objective lens OL and the relay lens $L_3$, whereafter it is re-imaged on the image receiving surface of an image pickup tube 1 by the second relay lens $L_4$ and is photoelectrically converted by the image pickup tube 1.

Figure 2:
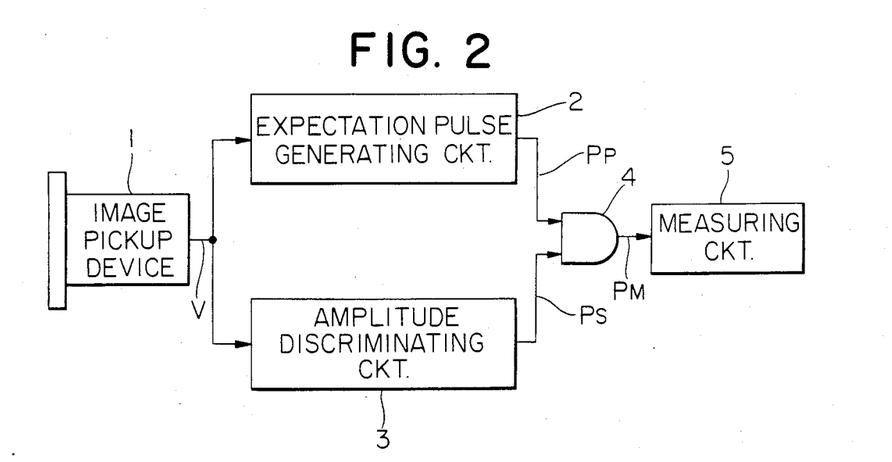
FIG. 2 is a basic block diagram showing the electrical system of the first embodiment.
Figure 3:
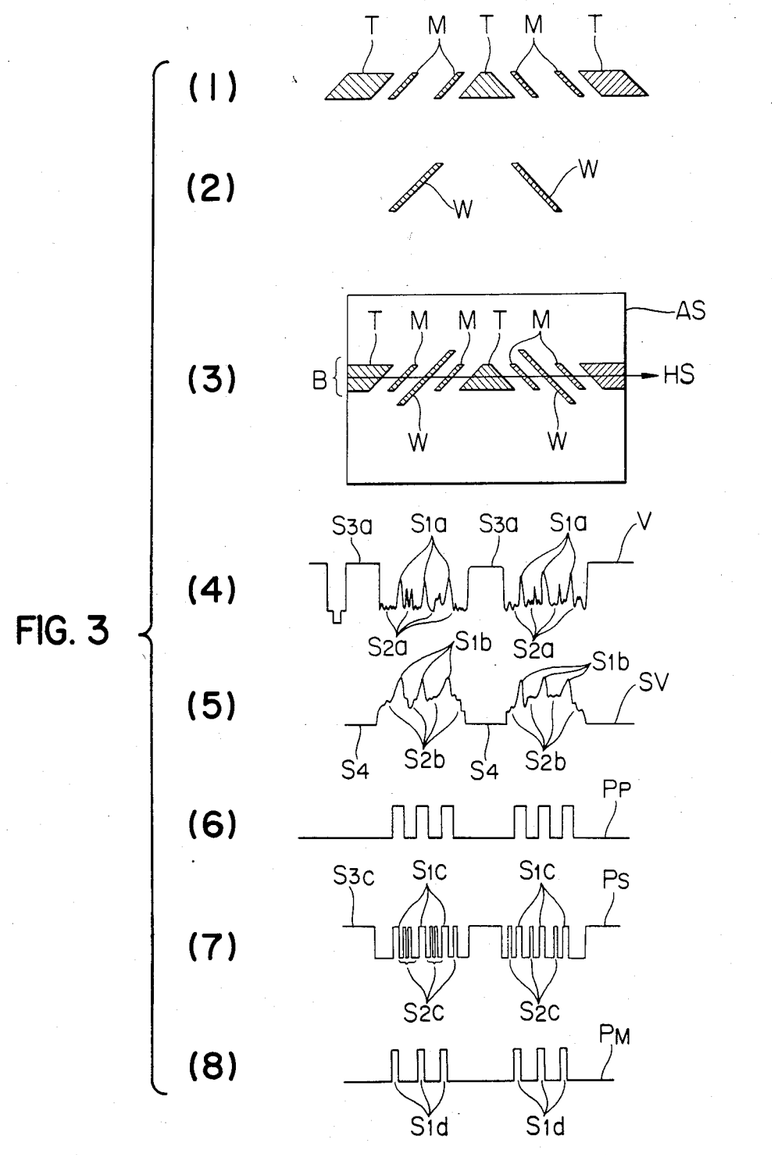

FIG. 2 depicts the basic form of the signal processing system, and the details of each circuit therein will be described later.

In FIG. 2, reference numeral 1 designates an image pickup device for photoelectric conversion which is the same as that shown in FIG. 1. Reference numeral 2 denotes a circuit connected to the image pickup device 1 that generates from a video signal V an expectation pulse signal Pp indicative of only a portion of the video signal V in which the probability with which the alignment marks exist is high. Reference numeral 3 designates a circuit which amplitude-discriminates the video signal V obtained from the image pickup device 1 by a potential of appropriate threshold value in a conventional manner and converts it into a digital signal. Denoted by 4 is a logical multiply (AND) circuit which logic-multiplies the expectation pulse signal Pp which is the output of the circuit 2 and the position information pulse signal Ps which is the output of the circuit 3 and puts out a measurement pulse signal $P_M$. Reference numeral 5 designates a circuit connected to the logical multiply circuit 4 and measuring the distance between the alignment mark signals of $P_M$.

In the above-described construction, consider, for example, a case where the mask side mark image shown in FIG. 3(1) and the wafer side mark image shown in FIG. 3(2) are photoelectrically converted by the image pickup device 1 to obtain a picture plane AS as shown in FIG. 3(3) and the video signal V by one horizontal scanning HS is input to the circuits 2 and 3. In the expectation pulse generating circuit 2, of the horizontal scanning of the entire picture plane AS, only the effective range B of measurement including the scanning line HS is input to obtain the expectation pulse signal Pp in which a portion wherein the probability with which an alignment mark signal $S_{1a}$ is included is high has been extracted from the video signal V. Also, the video signal V is amplitude-discriminated from the signal converting circuit 3 by a potential of appropriate threshold value to obtain a position information pulse signal Ps. This position information pulse signal Ps contains therein an alignment mark signal $S_{1c}$ and a false signal $S_{2c}$ that may result from dust or aluminum particles.

The mark pattern used in the present embodiment has an inclination of 45° with respect to the horizontal scanning line. Therefore, the expectation pulse signal Pp and the alignment mark signal $S_{1a}$ in the position information pulse signal Ps are positionally deviated from each other at each horizontal scanning on the time axis with respect to a horizontal synchronizing signal $V_{sync}$ as the reference. Thus, as a method of compensation, as shown in FIG. 3(1), a trigger mark pattern T is prepared on the mask and synchronization is taken by a trigger mark signal $S_{3a}$ resulting from the trigger mark pattern T. When the falling of the trigger mark signal $S_{3a}$ is detected, the expectation pulse generating circuit 2 begins to operate and puts out the expectation pulse signal Pp while taking the timing such that it is on the same time axis as the position information pulse signal Ps.

If these signals Ps and Pp are input to the logic multiply circuit 4, there is obtained a measurement pulse $P_M$ (FIG. 3(8)) in which only $S_{1c}$ has been extracted as from $S_{1d}$ from the position information pulse signal Ps. If the measurement pulse $P_M$ is input to the measuring circuit 5 and each pulse spacing of $S_{1d}$ is measured at each horizontal scanning and the average value of the spacings of $S_{1d}$ likewise obtained is found with respect also to all horizontal scannings which are in the range B, then that average value is the distance between the alignment marks and therefore, thereafter, the amount of deviation between the mask and the wafer can be calculated by a procedure similar to that of the prior art.

Figure 4:
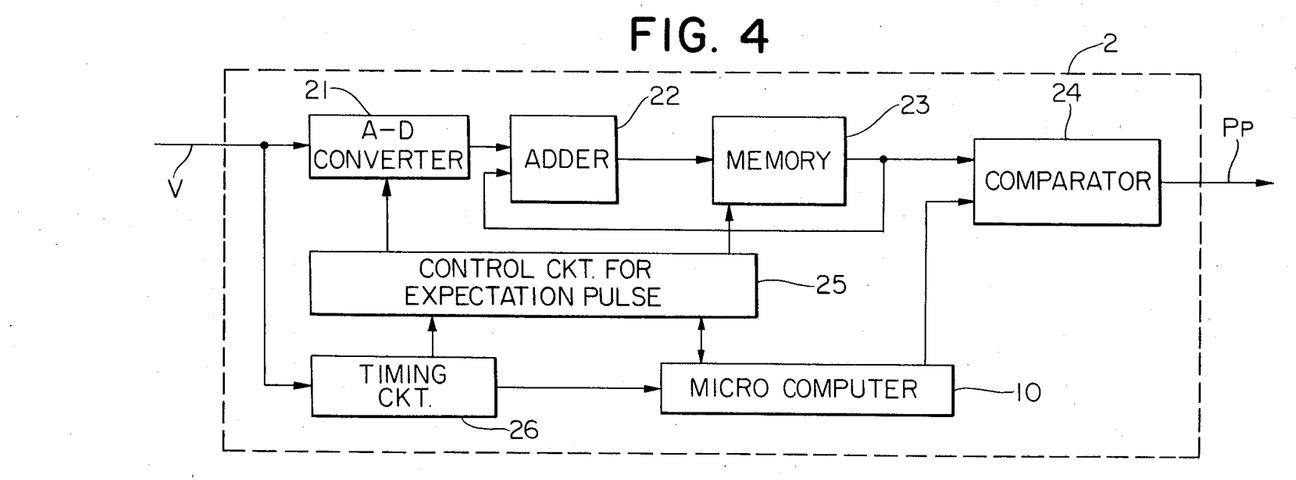
FIGS. 4, 5 and 6 are individual block diagrams showing the respective blocks of FIG. 2 in detail.

FIG. 4 shows the interior of the expectation pulse generating circuit 2 to explain the function thereof in detail. In FIG. 4, reference numeral 21 designates an A-D converter for A-D-converting the video signal V, reference numeral 22 designates an adder connected to the A-D converter 21 for summing the A-D-converted values of the video signal V, reference numeral 23 denotes a memory for storing the summed value produced by the adder 22, reference numeral 24 designates a comparator for amplitude-discriminating the summed value read from the memory 23 by a potential of appropriate threshold value and obtaining the expectation pulse signal Pp, reference numeral 25 denotes an expectation pulse control circuit which is connected to the A-D converter 21 and puts out a command for initiating the A-D conversion or puts, out a writing command to the memory 23 to set the timing of the summing, reference numeral 26 designates a timing generating circuit for detecting a horizontal synchronizing signal $V_{sync}$ from the video signal V and generating a clock pulse which determines the timing of the entire system, and reference numeral 10 denotes a micro computer for controlling the system.

In the above-described construction, there are in the memory 23 a number of memory units corresponding to the number into which one horizontal scanning is divided at an equal spacing, and these memory units are arranged so that the falling position of the signal $S_{3a}$ by the trigger pattern is the first. From the video signal V from which the horizontal synchronizing signal $V_{sync}$ has been eliminated by the command from the control circuit 25, only a portion of the video signal which includes the position information is A-D-converted and input to the adder 22. The summed value stored in the memory 23 enters the other input of the adder 22 and is added thereby and is again written into the memory 23. If the content stored in the memory 23 is expressed as a time-serial signal, it will become a signal SV as shown in FIG. 3(5). The portion S4, which does not include the signal accumulated as signal SV, is not stored in the memory 23 and the time axis is adjusted to the position information pulse signal Ps with the synchronization taken at the rising portion of the trigger mark signal $S_{3a}$. The portion $S_{2b}$ in which the false signal $S_{2a}$ resulting from for example dust and aluminum particles which has been contained in the video signal V is accumulated over the range B, is averaged, and therefore assumes a low level as compared with the summed portion $S_{1b}$ by the mark signal $S_{1a}$. Accordingly, a potential of threshold value which can avoid $S_{2b}$ is determined by the micro computer 10 and is compared with SV by the comparator 24 and the expectation pulse Pp is obtained as the output thereof. The control circuit 25 controls the initiation of the conversion of the A-D converter 21 by a clock pulse obtained by equally dividing the period of the horizontal synchronizing signal $V_{sync}$ by the timing generating circuit 26 and the readout of the summed value stored in the memory 23, with the signal obtained by detecting the falling of the signal $S_{3a}$ indicative of the trigger mark in the timing generating circuit 26 being used as the timing of sampling.

Figure 5:
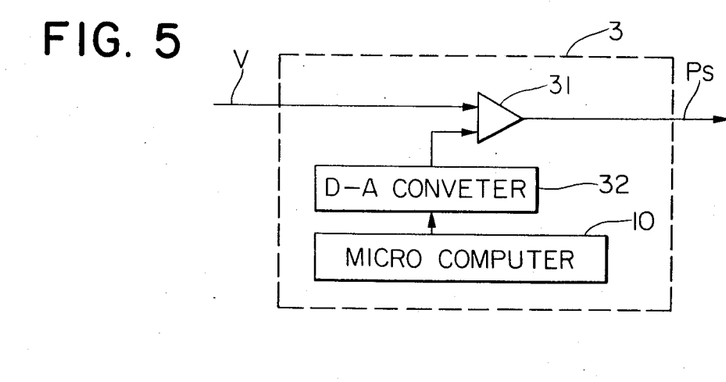

On the other hand, FIG. 5 shows the interior of the amplitude discriminating circuit 3 to explain the function thereof in detail. In FIG. 5, reference numeral 10 designates the aforementioned micro computer for controlling the system, reference numeral 32 denotes a D-A converter for converting the potential of suitable threshold value given by the micro computer 10 into an analog signal, and reference numeral 31 designates a comparator which amplitude-discriminates the video signal V by the potential of threshold value. In the above-described construction, the video signal V input to the comparator 31 is compared with a potential whose appropriate threshold value given by the micro computer 10 is D-A-converted by the D-A converter 32 and input to the other input of the comparator 31, whereby a position information pulse signal Ps is obtained. The position information pulse signal Ps contains therein a signal $S_{1c}$ by the alignment marks, a false signal $S_{2c}$ resulting from, for examples dust and aluminum particles, and a signal $S_{3c}$ by the trigger mark.

The position information pulse signal Ps and the expectation pulse Pp are formed in the manner described above and are input to the logical multiply circuit 4, whereby an output $P_M$ is obtained.

Figure 6:
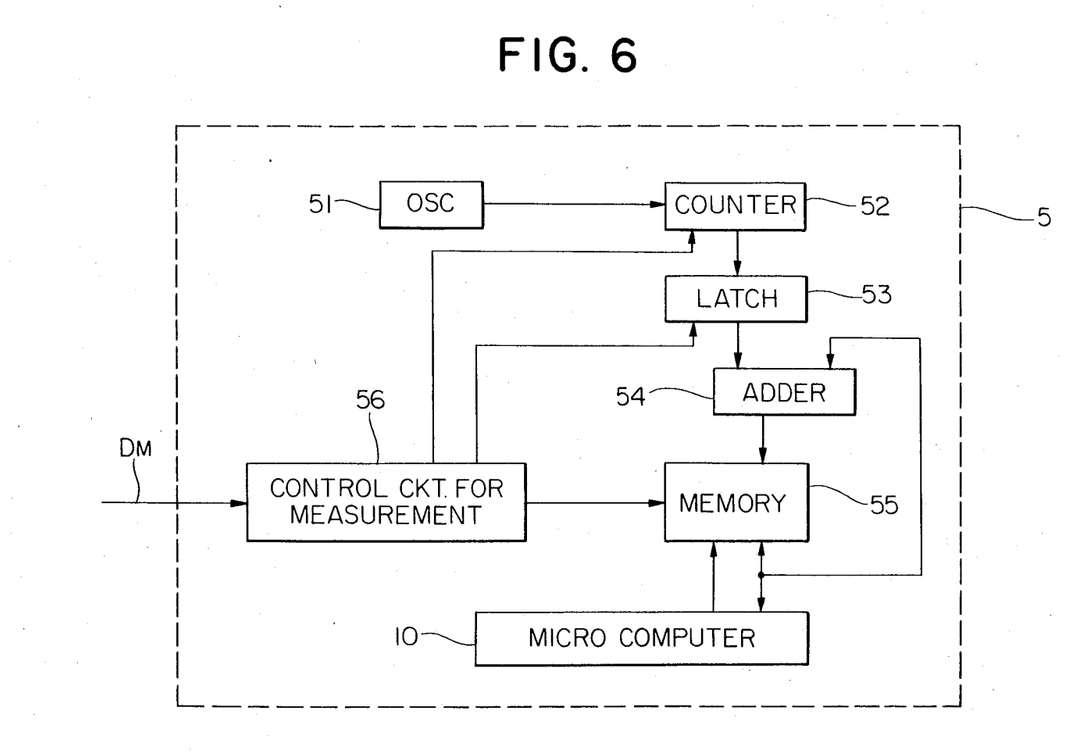

FIG. 6 fully shows the interior of the block of the measuring circuit 5 shown in FIG. 2. In FIG. 6, reference numeral 51 designates an oscillator which generates measuring clock pulses, reference numeral 52 denotes a counter connected to the oscillator 51 and counting the clock pulses, reference numeral 53 designates a latch for temporally storing the content of the counter 52, reference numeral 54 denotes an adder for adding the content of the latch 53 and the content of a circuit 55, reference numeral 55 designates a memory for storing the output of the adder 54, reference numeral 56 denotes a control circuit for controlling the measurement, and reference numeral 10 designates the micro computer for controlling the system.

In the above-described construction, if a measurement pulse $P_M$ resulting from one horizontal scanning HS is input to the measuring control circuit 56, when the first rising or falling of $S_{1d}$ is detected, a command for resetting the content is put out to the counter 52 and, when the rising or falling of $S_{1d}$ is detected, the value so far counted by the counter 52 is transferred to the latch 53, and this value and the count value by another horizontal scanning stored in the memory 55 are added together by the adder 54. The measured values in the successive horizontal scannings included in the effective measurement range B are accumulated in the memory 55. This accumulated value of measurement is input to the micro computer 10, whereby the average value is calculated, and then the distance between the alignment marks is found.

Figure 7:
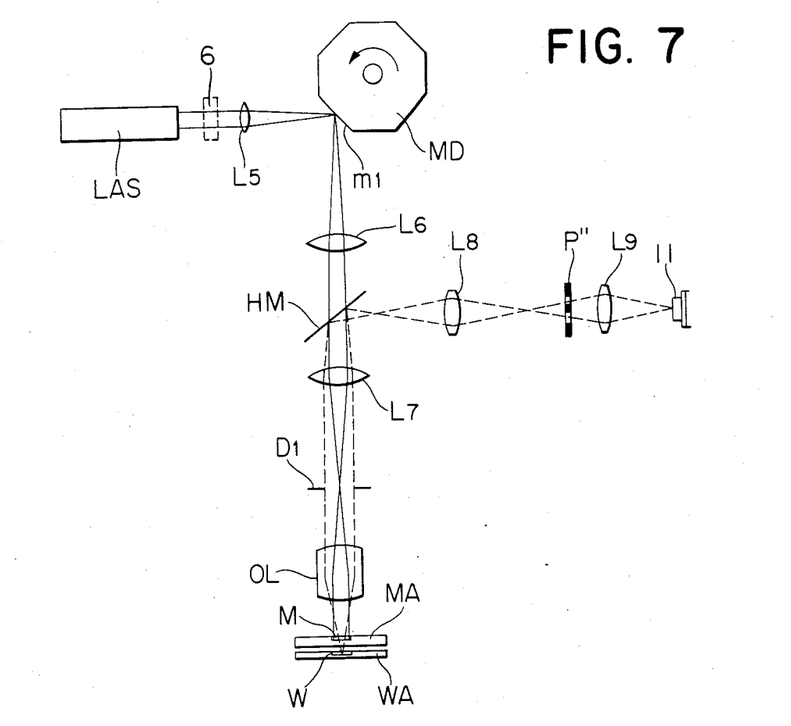
FIG. 7 is a cross-sectional view of a light-receiving system according to a second embodiment of the present invention.

FIG. 7 shows a photoelectric detecting system according to another embodiment. The system of FIG. 1 scans the mark images, whereas the system of FIG. 7 directly scans the marks. In FIG. 7, only one side of the system is depicted.

In FIG. 7, MA designates a mask, WA denotes a wafer, M and W designate the marks of the mask and the wafer, respectively, and OL denotes a microscope objective lens. On the other hand, LAS designates a light source which oscillates a laser, $L_5$ denotes a condenser lens, and MD designates a mirror drum rotated at a high speed. The laser light is condensed on the element mirror m1 of the mirror drum MD. $L_6$ and $L_7$ designate relay lenses. Since the element mirror m1 and a diaphragm $D_1$ are conjugately related to each other by the relay lenses, the laser light scans the marks M and W in such a form as if it were vibrated at the focus position of the objective lens OL. The elements from the objective lens OL to the light source LAS together constitute a scanning type illuminating system.

On the other hand, HM designates a half-mirror, $L_8$ and $L_9$ denote further relay lenses, and 11 designate a photoelectric conversion element. The light-receiving surface of a photoelectric conversion element 11 is substantially conjugate with the marks M and W. P" designates a light-intercepting plate for covering the positive reflected image of the reflection point of the laser light by the mirror drum MD. In addition to the half-mirror HM, the relay lenses $L_8$, $L_9$, the light-intercepting plate P" and the photoelectric conversion element 11, the relay lens $L_7$, the diaphragm $D_1$ and the objective lens OL together consitute a light-receiving system.

In the above-described construction, rotation of the mirror drum MD causes the condensed laser light to be deflected and pass through the lenses $L_6$, $L_7$ and the objective lens OL to scan the marks M and W on the mask and the wafer. Of the light beam reflected by the marks M and W, the regularly reflected light is thereafter intercepted by the light-intercepting plate P", while the irregularly reflected light is converged by the objective lens OL and relay lens $L_7$, is reflected by the half-mirror HM, passes through the relay lenses $L_8$, $L_9$ and is condensed on the photoelectric conversion element 11, and the variation in quantity of the incident light is converted into an electrical signal.

Figure 8:
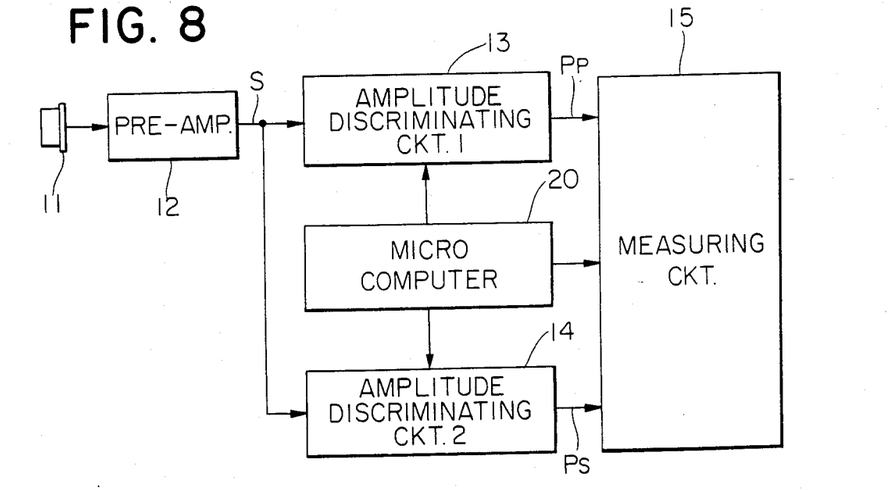
FIG. 8 is a block diagram showing the electrical system of the second embodiment.
Figure 9:
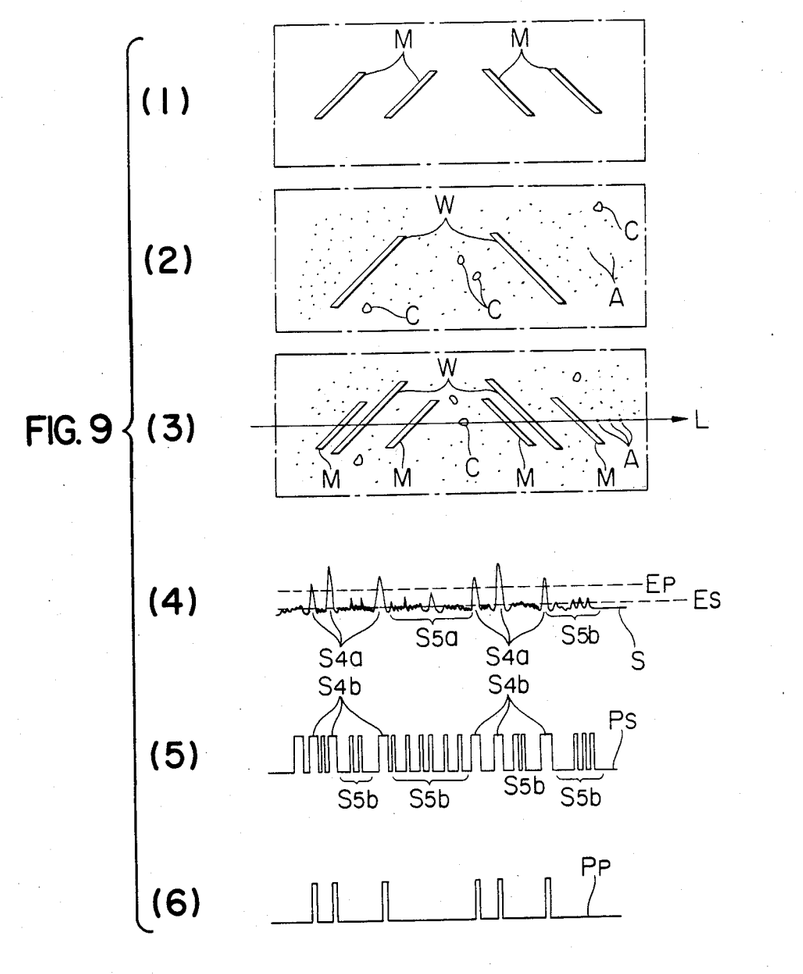

FIG. 8 depicts the basic form of the signal processing system, and the details of each circuit therein will be described later. In FIG. 8, reference numeral 11 designates a photoelectric conversion element for detecting a light signal returning from an object to be aligned. The photo-electric conversion element 11 is connected to a preamplifier 12, the output of which is input to first and second amplitude discriminating circuits 13 and 14. The outputs of the circuits 13 and 14 and the command signal of a micro computer 20 are input to a measuring circuit 15, and the micro computer 20 also imparts a command to the circuits 13 and 14.

In the above-described construction, if alignment marks M on a mask shown in FIG. 9(1) and alignment marks W on a wafer as shown in FIG. 9(2) which dust C and aluminum particles A have been deposited are scanned by a laser L with these marks superposed one upon another as shown in FIG. 9(3), there is obtained a position information signal S resulting from the light signal detected by the photoelectric detecting element 11 being amplified by the preamplifier 12. The position information signal S contains therein a signal $S_{4a}$ by the alignment marks and in addition, a false signal $S_{5a}$ and $S_{5b}$ from the aluminum particles A and dust C.

Since, however, generally the relation between the diameter of the laser beam and the line width of the mark pattern can be optimized (as by selecting the on-axis position and refractive power of the condenser lens $L_5$ in the relation to the line width), the signal intensity of the signal $S_{4a}$ can be detected at a high level as compared with the signal $S_{5a}$ and $S_{5b}$ of the portion corresponding to the random line width. In the first amplitude discriminating circuit 13 to which the position information signal S has been input, a threshold value Ep which can amplitude-discriminate only the signal $S_{4a}$ by the alignment marks while avoiding the false signal $S_{5a}$ as shown in FIG. 9(4) is generated from the micro computer 20. Accordingly, the expectation pulse signal Pp only of the alignment mark signal $S_{4a}$ is obtained as the output of the circuit 13.

As is apparent from the foregoing description, the expectation pulse signal Pp amplitude-discriminates with an amplitude relatively approximate to the peak of the position information signal S and therefore, the pulse width of the signal Pp is narrow as compared with the pulse width of the alignment mark signal $S_{4b}$ of the position information pulse signal Ps. Further, since the portion of the signal $S_{4a}$ which is near the peak is susceptible to the influence of optical strain, it is difficult to measure the spacing between the alignment marks highly accurately by the pulse signal Pp obtained by amplitude-discriminating said portion. Therefore, in the second amplitude-discriminating circuit 14, the portion of the signal $S_{4a}$ and $S_{5b}$ by the alignment marks which is free of the influence of optical strain is amplitude-discriminated by an amplitude-discriminating threshold value Es and at this time, the false signal $S_{5a}$ and $S_{5b}$ resulting from dust C and aluminum particles A is also converted into a pulse, whereby there is obtained the signal Ps. Subsequently, the position information pulse signal Ps and the expectation pulse signal Pp are input to the measuring circuit 15, and the pulse spacing is measured with respect only to the pulse appearing simultaneously with the pulse of the expectation pulse signal Pp in the position information pulse signal Ps, namely, the pulse signal $S_{4b}$ indicative of the alignment marks.

Figure 10:
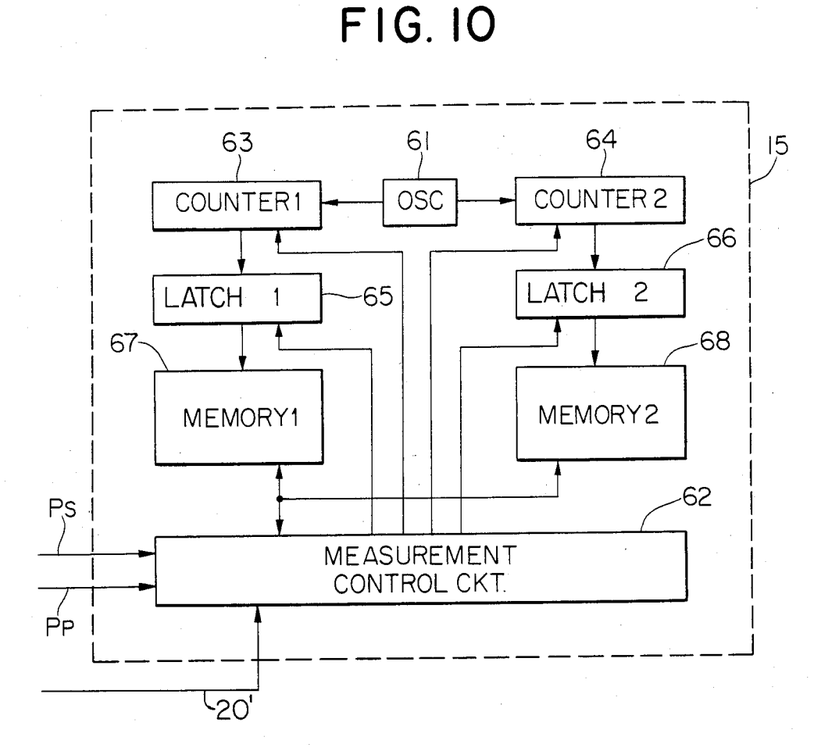
FIG. 10 is a block diagram showing some electric blocks in detail.
Figure 11:
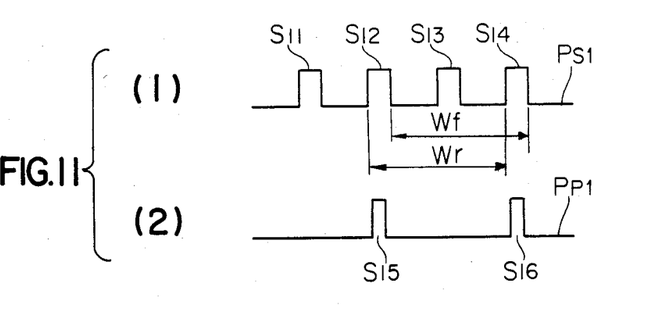

FIG. 10 shows the construction of the interior of the measuring circuit 15 in the block diagram of FIG. 8 to explain the function thereof in detail. In FIG. 10, reference numeral 61 designates an oscillator which generates measuring clock pulses, and reference numeral 62 denotes a control circuit which receives the signals Ps and Pp as input and effects the control of the measurement in response to the command from the micro computer 20 on line 20'. The circuit 62 is connected to the oscillator 61 and puts out a reset command to first and second counters 63 and 64 which count the clock pulses, a set command to first and second latches 65 and 66 which temporally store the contents of the counters 63 and 64, and a transfer command to first and second memories 67 and 68 which store the measured value of the mark pattern spacing. Each two sets of counters, latches and memories are provided to separately measure the rising and falling of the pulse signal $S_{4b}$ indicative of the alignment marks.

Consider, for example, a case where there is obtained a position information signal $P_{s1}$ containing therein signals $S_{12}$ and $S_{14}$ by the alignment marks and false signals $S_{11}$ and $S_{13}$, as shown in FIG. 11(1) and the then expectation pulse signal $P_{p1}$ is as shown in FIG. 11(2). Actually, the measurement is continued until six expectation pulses $Pp_1$ are obtained, but only the initial state is described in this description. That is, the falling spacing Wf of the alignment mark signal may be measured with attention paid only to the falling of the pulse signals $S_{12}$ and $S_{14}$ of the signal $P_{s1}$ in which $S_{15}$ and $S_{16}$ are detacted at that time. That is, the first counter 63 is reset at $S_{15}$ which is the first pulse $Pp_1$, the address which designates the area for storing the first spacing is set in the first memory 67, the first counter 63 is started from the falling of the pulse $S_{12}$ detected simultaneously with the pulse $S_{15}$, the so far counted value of the first counter 63 is transferred to the first latch 65 upon falling of $S_{14}$ detected simultaneously with $S_{16}$ which is the next expectation pulse, and is further written into the first memory 67. If attention is likewise paid only to the pulse signal on Ps obtained simultaneously with the expectation pulse Pp, only the falling spacing by $S_{4b}$ can be measured while avoiding the false signal $S_{5b}$ existing on the position information pulse signal Ps.

To measure the rising spacing Wr of $S_{12}$ and $S_{14}$ shown in FIG. 11(1), the content of the second counter 64 is transferred to the second latch 66 upon rising of all the pulses detected by $Ps_1$, and the storing in the second memory 68 is effected by the expectation pulse $Pp_1$. Initiation of the measurement is decided by the rising pulse of $Ps_1$ detected simultaneously with $Pp_1$. In FIG. 10, the second counter 64 is cleared upon rising of $S_{11}$ to start counting, but $Pp_1$ is not detected until the falling of $S_{11}$ and therefore, when the rising of $S_{12}$ existing in Ps is then detected, the content of the second counter 64 is again cleared and counting is started. When $S_{15}$ on $Pp_1$ is detected before the falling of $S_{12}$, initiation of the measurement is decided and thereafter, the second counter 64 is never cleared. Subsequently, upon rising of $S_{13}$, the current content of the second counter 64 is transferred to the second latch 66, but the second counter 64 continues to count. Since no pulse is detected on $Pp_1$ until the falling of $S_{13}$, nothing is stored in the second memory 68. Further, upon rising of $S_{14}$, the so far counted value is again transferred to the second latch 66 and, by $S_{16}$ detected simultaneously therewith, the content of the second latch 66 is stored in the second memory. This stored value is Wr.

The rising and falling spacings of the signal by the alignment marks found in the described manner have their average found by the use of the prior art technique, whereby the spacing between the alignment marks is obtained.

Also, the spacing between the trigger mark T and the alignment mark M can be determined highly accurately during the manufacture of the mask. Accordingly, if this spacing, like other alignment marks, is measured by the measuring circuit 5, the measured value of the spacing between the alignment marks can be corrected with that measured value as the reference and this leads to the possibility of more accurate measurement corresponding to the actual amount of deviation.

If, in FIG. 3(1), use is made of a mask having the trigger mark T alone with the alignment mark M removed therefrom and T, instead of M, is used as the alignment mark, measurement of the relative position can be accomplished as in the case of M. Further, if use is not made of a pattern like that of the embodiment but use is made of a pattern which will permit the relative positional relation between the mask and the wafer to be found, highly accurate position measurement can be realized by a system having such a construction as described above.

In the embodiment of the present invention, synchronization is taken by preparing a trigger mark pattern in addition to the conventional alignment mark pattern, but also possible is a system in which use is made of an alignment mark pattern free of the trigger mark pattern which has conventionally been used. The feature of the shape in which the pattern is inclined at a predetermined angle is utilized to instruct the initiation of summation timing during each horizontal scanning from a control circuit in a predetermined sequence, or a method in which the initiation of timing of the horizontal scanning is varied by a special image pickup device.

Further, in a second embodiment, if only the expectation pulse signal Pp is used, coarse alignment which does not require high accuracy can be accomplished, or if, in FIG. 2, an ultrasonic deflecting element 6 is provided between the laser light source LAS and the condenser lens $L_5$ to deflect the light in a direction perpendicular to the plane of the drawing sheet, the laser light will positionally deviate and scan the marks and. Therefore, the expectation pulse signal can be taken out by a system similar to the electrical system described in connection with the first embodiment.

The method of above-described first embodiment of the present invention, when measuring the relative position of the mark on a first body and the mark on a second body, comprises the step of repetitively scanning the two marks so that a positional deviation is created and detecting the signals by the two marks, the step of repetitively accumulating the component signals by the scanning, the step of separating portions of different characteristics among the accumulated signals to specify the portions corresponding to the marks, and the step of extracting a true signal necessary for position measurement from the signals resulting from the two marks by referring to the separated portions of the signals. Especially, to meet a case where scanning is effected with the marks positionally deviated, one of the marks and the mark necessary for position adjustment can be optically or electrically identified and include trigger marks spaced at a predetermined interval. The step of correcting the measurement is executed with the measured value of this interval as the reference. The method of a second embodiment comprises the step of scanning substantially the same scanning line and detecting the signals resulting from the two marks, the step of amplitude-discriminating those signals by threshold values of different levels, and the step of extracting a true signal necessary for position measurement from the signal discriminated by the lower threshold value by referring to the signal discriminated by the higher threshold value.

Thus, according to the present invention, the relative position between a plurality of bodies which produce false signals can be accurately measured and moreover, no great change need be applied to the illuminating system. Accordingly, if the present invention is adopted in a semiconductor manufacturing apparatus or the like and is used for alignment, the drawbacks such as occurrence of misalignment due to the presence of dust and aluminum particles on the wafer and lengthened regulation time for alignment will be eliminated and the time required for cleaning each wafer can be remarkably reduced.

What I claim is:

1. A position detection signal processing apparatus comprising:
    pattern detecting means for detecting a pattern on a body and repeatedly producing a detection signal including at least one part representative of the pattern;
    expectation signal forming means for forming an expectation signal which specifies the portion of said detection signal in which the probability is high if occurrence of part of the detection signal representative of the pattern, said expectation signal forming means including summing means for forming a summation of repeated production of the detection signal and for forming a summation signal therefrom, and summation discriminating means for discriminating said summation signal in accordance with a desired threshold value; and
    pattern signal forming means for forming a pattern outout signal corresponding to-the pattern from said detection signal and said expectation signal.

2. The apparatus according to claim 1, wherein said discriminating means includes an amplitude discriminating circuit.

3. The apparatus according to claim 1, wherein said expectation signal forming means further includes sampling means for time-serially sampling the detection signal and converting means for analog-digital-converting the output of said sampling means.

4. The apparatus according to claim 1, wherein said pattern detecting means includes an image detector for producing a video signal and an illuminator for illuminating the pattern.

5. The apparatus according to claim 4, wherein said image detector is an image pickup tube.

6. The apparatus according to claim 4, wherein said pattern detecting means scans the pattern in a scanning direction for detection, and said pattern has elemental marks inclined with respect to said scanning direction and at least one trigger mark adjacent to said elemental marks and including an edge having the same inclination as said elemental marks.

7. The apparatus according to claim 1, further comprising:
    means for scanning the pattern with a beam of radiation; and
    pattern discriminating means for discriminating the first edge of the pattern when the pattern is scanned by said scanning means.

8. The apparatus according to claim 7, wherein the pattern includes a trigger pattern and a mark pattern, the trigger pattern preceding the mark pattern, and wherein said pattern discriminating means produces a signal in response to scanning by said scanning means of the trigger pattern before the first pulse produced in response to scanning by said scanning means of the mark pattern.

9. A position detection signal processing apparatus comprising:
    pattern detecting means for detecting a pattern on a body and producing a detection signal including at least one part representative of the pattern;
    expectation signal froming means for forming an expectation signal which specifies the portion of said detection signal in which the probability is high of occurrence of a part of the detection signal representative of the pattern; and
    pattern signal forming means for forming a pattern output signal corresponding to the pattern from said detection signal and said expectation signal, said expectation signal forming means having first discriminating means for discriminating said detection signal in accordance with a first threshold value higher than a noise component, and said pattern signal forming means having second discriminating means for discriminating said signal in accordance with a second threshold value lower than said first threshold value.

10. The apparatus according to claim 1, wherein said body is one of a mask having a semiconductor integrated circuit pattern and a wafer provided with a photosensitive layer.

11. A signal processing method for processing signals representing alignment marks on a mask and a wafer, said method comprising the steps of:
   detecting at least one alignment mark provided on a mask and at least one alignment mark provided on a wafer and repeatedly producing a detection signal therefrom;
   producing a summation of repeated production of the detection signal and producing a summation signal represented thereof;
   discriminating the summation signal in accordance with a desired threshold value and producing an expectation signal therefrom; and
   producing signals corresponding to said alignment marks from said detection signal and said expectation signal.

12. A position detection signal processing apparatus comprising:
   pattern detecting means for detecting a general pattern, including a trigger pattern and a mark pattern located on a scan line on a body, by scanning the body along the scan line, said pattern detecting means producing a detection signal including at least a part representative of the mark pattern;
   expectation signal forming means for forming an expectation signal which specifies the portion of said detection signal in which the probability is high of occurrence of the part of the detection signal representative of the mark pattern; and
   pattern signal forming means for forming a pattern output signal corresponding to the pattern from said detection signal and said expectation signal.

13. The apparatus according to claim 9 or 12, wherein the detection signal is repeatedly produced by said detecting and producing means and wherein said expectation signal forming means includes summing means for forming a summation of the repeated production of the detection signal and for forming a summation signal therefrom, and discriminating means for discriminating said summation signal in accordance with a desired threshold value.

14. The apparatus according to claim 13, wherein said discriminating means is an amplitude discriminating circuit.

15. The apparatus according to claim 13, wherein said expectation signal forming means further includes sampling means for time-serially sampling the detection signal and a converting means for analog-digital-converting the output of said sampling means.

16. The apparatus according to claim 9 or 12, wherein said pattern detecting means includes an image detector for producing a video signal and an illuminator for illuminating the pattern.

17. The apparatus according to claim 16, wherein said image detector is an image pickup tube.

18. The apparatus according to claim 16, wherein said pattern detecting means scans the general pattern in a scanning direction along the scanning line for detection, and said mark pattern has elemental marks inclined with respect to said scanning direction and said trigger pattern has at least one trigger mark adjacent to said elemental marks and including an edge having the same inclination as said elemental marks.

19. The apparatus according to claim 9 or 12, further comprising:
   means for scanning the general pattern with a beam of radiation; and
   discriminating means for discriminating the first edge of the general pattern when the general pattern is scanned by said scanning means.

20. The apparatus according to claim 19, wherein the trigger pattern precedes the mark pattern, and wherein said discriminating means produces a signal in response to scanning by said scanning means of the trigger pattern before the first pulse produced in response to scanning by said scanning means of the mark pattern.

21. The apparatus according to claim 12, wherein said expectation signal forming means has first discriminating means for discriminating said detection signal in accordance with a first threshold value higher than a noise component, and said pattern signal forming means has second discriminating means for discriminating said signal in accordance with a second threshold value lower than said first threshold value.

22. The apparatus according to claim 9 or 12, wherein said body is one of a mask having a semiconductor integrated circuit pattern and a wafer provided with a photosensitive layer.

23. A position detection signal processing apparatus comprising:
   pattern detecting means for detecting a pattern on a body and producing a detection signal including at least one part representative of the pattern, wherein said pattern has elemental marks inclined with respect to a scanning direction and at least one trigger mark including an edge having the same inclination as said elemental marks;
   expectation signal forming means for forming an expectation signal which specifies a portion of the detection signal representative of the trigger mark in order to specify the portion of the detection signal in which the probability is high of occurrence of a part of the detection signal representative of the elemental marks;
   and pattern signal forming means for forming a pattern output signal corresponding to the pattern from said detection signal and said expectation signal.

24. A position detection signal processing method comprising the steps of:
   detecting a pattern on a body and producing a detection signal including at least one part representative of the pattern, wherein said pattern has elemental marks inclined with respect to a scanning direction and at least one trigger mark including an edge having the same inclination as said elemental marks;
   forming an expectation signal which specifies a portion of the detection signal representative of the trigger mark in order to specify the portion of the detection signal in which the probability is high of occureence of a part of the detection signal representative of the elemental marks; and
   forming a pattern output signal corresponding to the pattern from said detection signal and said expectation signal.

* * * * *

UNITED STATES PATENT AND TRADEMARK OFFICE
CERTIFICATE OF CORRECTION

PATENT NO. : 4,599,000            Page 1 of 2
DATED : July 8, 1986
INVENTOR(S) : YASUYOSHI YAMADA It is certified that error appears in the above-identified patent and that said Letters Patent is hereby corrected as shown below:

IN THE DRAWINGS

Sheet 3, Fig. 5, "D-A CONVETER" should read --D-A CONVERTER--.

COLUMN 4

Line 10, "as from" should read --as--.
Line 36, "puts," should read --puts--.
Lines 63-64, "signal signal" should read --signal--.
Line 65, "for example" should read --, for example,--.

COLUMN 5

Line 32, "for examples" should read --for example,--.

COLUMN 6

Line 32, "consitute" should read --constitute--.
Line 52, "photo-electric" should read --photoelectric--.

COLUMN 7

Line 2, "$S_{5b}$ from" should read --$S_{5b}$ resulting from--.

COLUMN 8

Lines 7-8, "detacted" should read --detected--.

UNITED STATES PATENT AND TRADEMARK OFFICE
CERTIFICATE OF CORRECTION

PATENT NO. : 4,599,000
DATED : July 8, 1986
INVENTOR(S) : YASUYOSHI YAMADA

It is certified that error appears in the above-identified patent and that said Letters Patent is hereby corrected as shown below:

COLUMN 9

Line 22, "marks and." should read --marks.--.

COLUMN 10

Line 10, "if occurrence of part" should read --of occurrence of a part--.
    Line 19, "to-the" should read --to the--.
    Line 62, "froming" should read --forming--.

COLUMN 12

Line 63, "occureence" should read --occurrence--.

Signed and Sealed this

Twelfth Day of July, 1988

Attest:

DONALD J. QUIGG

Attesting Officer    Commissioner of Patents and Trademarks